United States Patent [19]
Sato

[11] Patent Number: 5,989,337
[45] Date of Patent: Nov. 23, 1999

[54] METHOD OF GROWING SINGLE CRYSTAL

[75] Inventor: Kenji Sato, Toda, Japan

[73] Assignee: Japan Energy Corporation, Tokyo, Japan

[21] Appl. No.: 08/817,300

[22] PCT Filed: Aug. 26, 1996

[86] PCT No.: PCT/JP96/02373

§ 371 Date: Apr. 15, 1997

§ 102(e) Date: Apr. 15, 1997

[87] PCT Pub. No.: WO97/10372

PCT Pub. Date: Mar. 20, 1997

[30] Foreign Application Priority Data

Sep. 12, 1995 [JP] Japan .................................... 7-234282
Jan. 25, 1996 [JP] Japan .................................... 8-010930

[51] Int. Cl.⁶ ...................................................... C30B 11/12
[52] U.S. Cl. .............................. 117/81; 117/83; 117/204; 117/205; 117/206
[58] Field of Search .............................. 117/81, 83, 200, 117/204, 205, 206

[56] References Cited

FOREIGN PATENT DOCUMENTS 7-51471   6/1995   Japan .

OTHER PUBLICATIONS

B. Lunn and V. Bettridge, *Revue De Physique Appliquee*, Tome 12, pp. 151–154, (Febrier 1977).

A.W. Vere, V. Steward, C.A. Jones, D.J. Williams and N. Shaw, *Journal of Crystal Growth*, vol. 72, pp. 97–101 (1985).

J.B. Mullin, C.A. Jones, B.W. Straughan and A. Royle, *Journal of Crystal Growth*, vol. 59 pp. 135–142 (1982).

*Primary Examiner*—Felisa Hiteshew
*Attorney, Agent, or Firm*—Birch, Stewart, Kolasch & Birch, LLP

[57] ABSTRACT

An object of the present invention is to prevent introduction of cracks or defects into the grown single crystal and to obtain a compound semiconductor single crystal having a good crystallinity and no cracks. In the method, after ZnTe polycrystalline raw material and Te solvent are put in a crucible 3, they are heated by a heater 1 to make a solution by dissolving the ZnTe polycrystalline raw material in the Te solvent. The solution is solidified to grow a ZnTe single crystal by using the Bridgman method or the gradient freeze method, and thereafter, the remaining Te solvent in the crucible 3 is removed out of the crucible 3 by evaporation, and then the grown crystal is taken out of the crucible 3.

6 Claims, 3 Drawing Sheets

METHOD OF GROWING SINGLE CRYSTAL

TECHNICAL FIELD

The present invention relates to a method for growing a single crystal and, in particular, to a useful technique applied to a method for growing a single crystal by precipitating a solute from a solution including a raw material dissolved in a solvent.

BACKGROUND ART

The Bridgman method and the gradient freeze method have been known as methods for growing a single crystal.

The Bridgman method which is one for growing a single crystal, comprises the steps of; putting a crucible filled with a polycrystalline raw material in a crystal growth furnace, heating the crucible by a heater to melt the material, and thereafter moving the crucible toward a lower temperature side in a temperature gradient of 10–50 ° C./cm which is formed in the furnace, to precipitate a solute which cannot keep dissolving in the solvent, on a lower temperature portion of the crucible. For example, Japanese Patent Application Publication (Examined) No. Tokuko-hei 7-51471 discloses a technique for obtaining a single crystal having a good stoichiometry and few defects, in which a reaction tube which connects a crystal growth chamber enclosing a container (crucible) containing a raw material therein to a storage chamber enclosing a host atom for controlling the vapor pressure thereof is used, and growth of the single crystal is carried out while controlling the vapor pressure of the host atom by controlling the temperature of the storage chamber enclosing the host atom.

The gradient freeze method which is one for growing a single crystal, comprises the steps of; heating a crucible filled with a polycrystalline raw material by a heater to melt the material in a crystal growth furnace, and thereafter changing the temperature profile in the crystal growth furnace by controlling the power supplied to the heater while retaining the crucible at a predetermined position, to precipitate a solute on a lower temperature portion of the crucible.

The present inventor proposed an improved technique of the Bridgman method or the gradient freeze method, which is one (hereinafter, it may be simply referred to a solvent method) for growing a compound semiconductor single crystal having a higher melting point, e.g., ZnSe, ZnTe or the like, than the softening point of quartz glass, comprises the steps of; putting a raw material and a solvent in a crucible, heating the crucible to make a solution by dissolving the material in the solvent, and moving the crucible toward a lower temperature side in a temperature gradient which is formed in a crystal growth furnace, or changing the temperature profile in the furnace, to precipitate a solute from the solution. This solvent method has the advantage that it is possible to easily obtain a compound semiconductor single crystal having a high melting point and a high dissociation pressure at low cost.

However, even if either of the Bridgman method and the gradient freeze method is adopted for the solvent method, there is a problem of occurrence of cracks or defects in the grown single crystal caused by thermal stress due to the difference between the coefficients of thermal expansion of the remaining solvent in the crucible and of the grown crystal, in a cooling step after the single crystal growth. The coefficient of thermal expansion of Te is $14 \times 10^{-6}$/K, and the coefficient of thermal expansion of ZnTe is about twice that of Te. Therefore, when a ZnTe single crystal is grown in a Te solvent, cracks occur or defects such as dislocation or the like are sometimes introduced into the grown single crystal, by the remaining Te solvent in the crucible even if cooling after the crystal growth was sufficiently gradually carried out.

The Journal of Crystal Growth, 72, p.97–101 (1985); the Journal of Crystal Growth, 59, p.135–142 (1982); and the REVUE DE PHYSIQUE APPLIQUEE, 12, P.151–154 (1977) reported solvent evaporation processes for precipitating CdTe solute by evaporating Cd solvent from a solution which comprises the Cd solvent and the CdTe solute, in order to grow a CdTe single crystal. In the process, a crucible 20 containing suitable amounts of Cd and CdTe therein is sealed in an ampoule 21, as shown in FIG. 3; and then only the temperature of a reservoir portion 26 is gradually shifted to the temperature profile below the point "A", which is shown by a dotted line, in a graph in the right side of FIG. 3, for showing the temperature profile, without changing the temperature of a crystal growth region 25, by adjusting the outputs of heaters 23 and 24; and thereby a single crystal 28 is grown while evaporating the solvent in the solution 27. The evaporated and thereafter condensed solvent 29 is accumulated in the reservoir portion 26. However, the solvent evaporation process has the disadvantages in that the process has no effect of gettering impurities by the solvent during the crystal growth, it is difficult to strictly control the evaporation rate of the solvent, and the process requires a complicated structure for communicating the crystal growth region 25 in the ampoule 21 with the reservoir portion 26 through an orifice 30.

The present invention has been developed so as to solve the above problems. An object of the present invention is to prevent introduction of cracks or defects into the grown crystal and to obtain a compound semiconductor single crystal having a good crystallinity and no cracks.

DISCLOSURE OF THE INVENTION

For achieving the above-described object, the present inventor considered that it was effective to remove the remaining solvent in the crucible by evaporation after the crystal growth by the solvent evaporation process and before cooling the crucible to take the grown crystal out. As a result of study on the basis of the above consideration, the inventor has completed the present invention.

That is, the present invention comprises the step of; putting a raw material and a solvent for dissolving the raw material in a crucible, making a solution by dissolving the raw material in the solvent, cooling the solution to solidify and to grow a single crystal, thereafter removing a remaining solvent in the crucible by evaporation, and thereafter taking the grown single crystal out of the crucible. Particularly, in an aspect of the invention, the method is characterized in comprising the steps of; putting a raw material and a solvent for dissolving the raw material in a crucible, making a solution by dissolving the raw material in the solvent, and growing a single crystal under a temperature gradient so that a vapor pressure of a solvent in the solution is lower than a vapor pressure of a solvent which was transported out of the crucible to exist at a predetermined position when the crystal growth is started, and under another temperature gradient so that the vapor pressure of the solvent in the solution is higher than the vapor pressure of the solvent which was transported out of the crucible to exist at the predetermined position when the crystal growth is finished. In another aspect of the invention, the method is characterized in comprising the steps of; putting a raw material and a solvent for dissolving the raw material in a crucible, making a solution by dissolving the raw material in the solvent, growing a single crystal under a temperature gradient which forms a temperature lower portion and a temperature higher portion in the crucible containing the solution and which has a temperature gradient under which the solvent in the crucible is hardly evaporated out thereof, thereafter removing the remaining solvent in the crucible by evaporation under a temperature gradient so that the evaporated solvent in the crucible is transported to the predetermined position which is outside the crucible, and thereafter taking the grown single crystal out of the crucible.

Preferably, the crucible containing the raw material and the solvent therein is enclosed in a sealed container which has a space for containing the crucible and another space for containing a solvent evaporated from the crucible, and thereby the growth of a single crystal is carried out. The grown single crystal is preferably a compound semiconductor one. The solution may comprise a solvent of Se or Te, and a raw material of ZnSe or ZnTe to be dissolved in the solvent.

BEST MODE OF THE INVENTION

A mode of the present invention will be explained.

Figure 1:
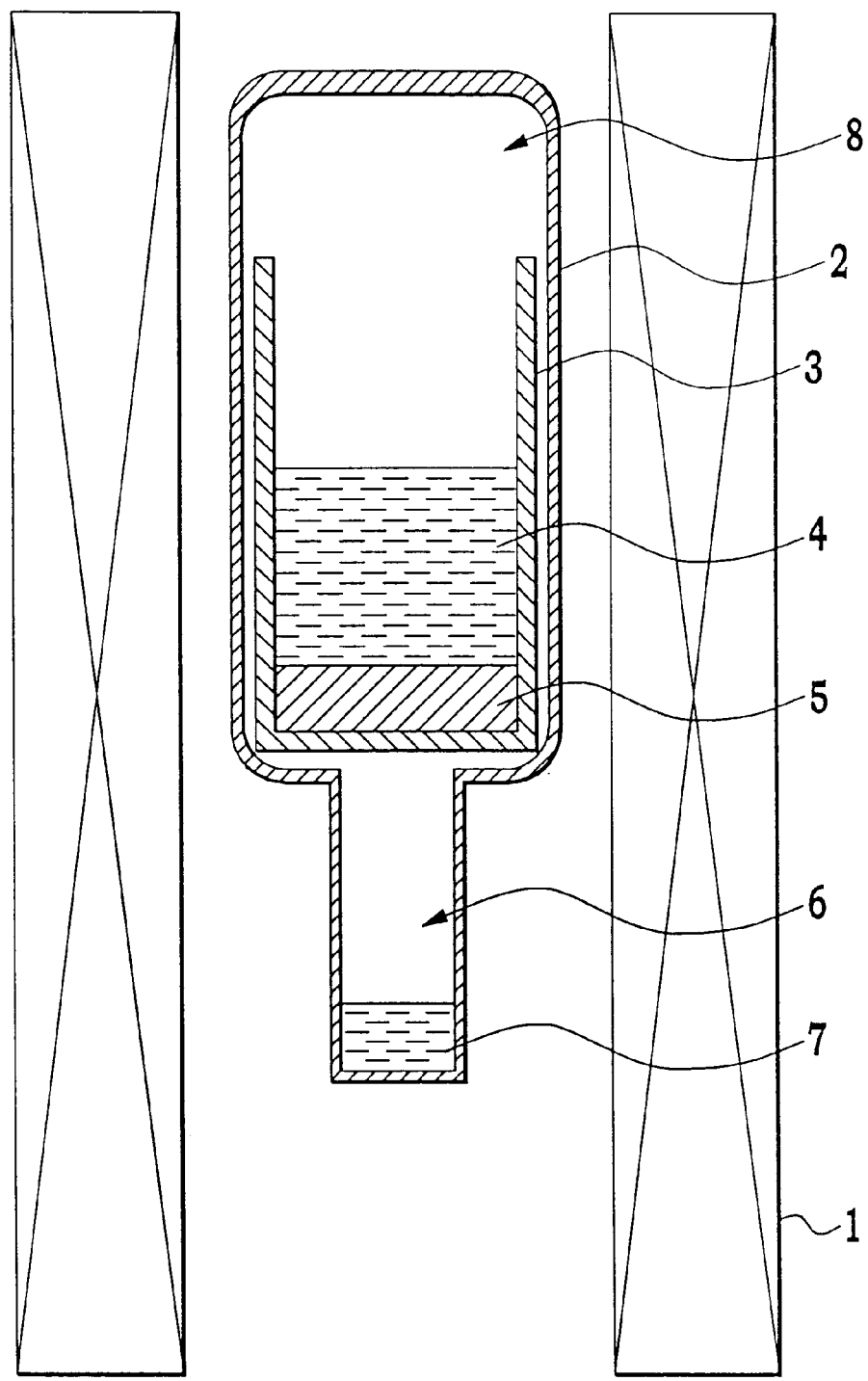
FIG. 1 is a schematic view for showing an embodiment of a crystal growth furnace used for carrying out the present invention.

FIG. 1 is a schematic view for showing an embodiment of a crystal growth furnace used for the present invention. In the furnace, a crucible 3 containing a compound semiconductor raw material and a solvent is enclosed in a closed tube system such as an ampoule 2 or the like, and the ampoule 2 is arranged at the center in a radial direction in a cylindrical multi-stage heater 1, the inner temperature distribution of which can be adjusted in a vertical direction. After the ampoule 2 is heated to sufficiently dissolve the compound semiconductor raw material in the solvent, the ampoule 2 is moved to a lower temperature side (the lower side in the Figure) in a predetermined temperature distribution in the furnace which is created by adjusting the power supplied to the heater 1, so that the solute is precipitated from the solution 4 to gradually grow a compound semiconductor single crystal 5 upward from the bottom of the crucible 3. The ampoule 2 has a structure comprising a space 8 (hereinafter, referred to a crystal growth chamber) for containing the crucible 3, and a space 6 (hereinafter, referred to a container space) for accommodating the solvent 7 which was condensed through evaporation from the solution 4, which is provided below the crystal growth chamber 8 to communicate with the chamber 8. Because the container space 6 is provided, evaporation of the solvent in the ampoule 2 is controllably carried out.

In order to grow a compound semiconductor single crystal by using a crystal growth furnace shown in FIG. 1, after the compound semiconductor raw material (solute) and the solvent are put in the crucible 3, the crucible is set in the crystal growth chamber 8 of the ampoule 2 and sealed in vacuum. A treatment for preventing evaporation of the solvent, that is, a control of the vapor pressure thereof, is performed. Thereafter, the power supplied to the heater 1 is increased to rise the temperature for the solute to sufficiently dissolve in the solvent. When the temperature has reached to an appropriate one, the solute is dissolved in an environment having almost zero temperature gradient. After the solute has been sufficiently dissolved, the power supplied to the heater 1 is adjusted to make a predetermined temperature distribution in the furnace and the crucible 3 is arranged under the temperature gradient in the distribution. The temperature distribution is set so that the temperature of a portion of the container space 6 is lower than that of the crucible 3 and thereby the evaporation of the solvent in the crucible 3 can be controlled. (That is, the temperature distribution is set so that the vapor pressure of the solvent when the solvent exists without solute in the container space 6 is higher than the vapor pressure of the solvent of the solution in the crucible 3.)

Then, the ampoule 2 is gradually moved to the lower temperature side to start a crystal growth. During the crystal growth, the temperature distribution is controlled by adjusting the power supplied to the heater 1 in order to prevent evaporation of the solvent. Generally, when the vapor pressure of a solute is lower than that of a solvent and a solution comprises the solvent and the solute dissolved therein, the vapor pressure of the solvent in the solution is lower than that of the solvent without solute. Therefore, even if the temperature of the container space 6 is lower than that of the crucible 3, when the vapor pressure of the solvent 7 existing without solute is higher than that of the solvent in the solution 4 including the solute, the solvent by evaporation from the crucible 3 is not transferred to the container space 6 nor precipitated therein. That is, because the solvent in the crucible 3 does not disappear by evaporation under such a condition, it is possible to grow a crystal by using the solvent.

When the crystal growth has been finished, cooling is not started immediately, and the temperature distribution in the furnace is properly controlled by adjusting the power supplied to the heater 1 to evaporate the remaining solvent in the crucible 3. During the evaporation, in contrast with during crystal growth, when the vapor pressure of the solvent 7 without solute at the temperature of the container space 6 is lower than that of the solvent of the solution 4 including the solute, the solvent 7 evaporated from the crucible 3 is transported to the container space 6 to precipitate. Therefore, by properly controlling the temperature distribution in the furnace (that is, by setting the vapor pressure of the solvent without solute in the container space 6 lower than that of the solvent of the solution in the crucible 3), it is possible to transport the remaining solvent in the crucible 3 into the container space 6 after the crystal growth and before the start of cooling, consequently, only a grown crystal remains in the crucible 3. After the solvent evaporation step, the cooling step for the grown crystal is performed. By carrying out those steps, it is possible to prevent occurrence of cracks or defects in the grown crystal caused by the difference between the coefficients of thermal expansion of the solvent and of the grown crystal, and to obtain a compound semiconductor single crystal having a good crystallinity and no cracks.

Although removal of the remaining solvent out of the crucible 3 after the crystal growth may be carried out by a mechanical manner, for example, by inclining the ampoule 2 or the like, such a mechanical manner requires a crystal growth furnace having a complicated structure.

The timing to start evaporation of the solvent may be in the course of the crystal growth, that is, the crystal growth and the evaporation of the solvent may be carried out simultaneously. When the vapor pressure of the solute is lower than that of the solvent, because the difference between the vapor pressure of the solution including the solute and that of the solvent without solute is the less, as the amount of the dissolved solute is the less, the solvent may evaporate of itself when the crystal growth progresses to some extent (that is, the amount of the dissolved solute is reduced by solute consumption) even if the temperature gradient during the crystal growth is not changed. In such a case, it is not required to specifically change the temperature gradient after the crystal growth, and the crystal growth and the evaporation of the solvent come to progress simultaneously after a certain stage of the crystal growth.

Figure 2:
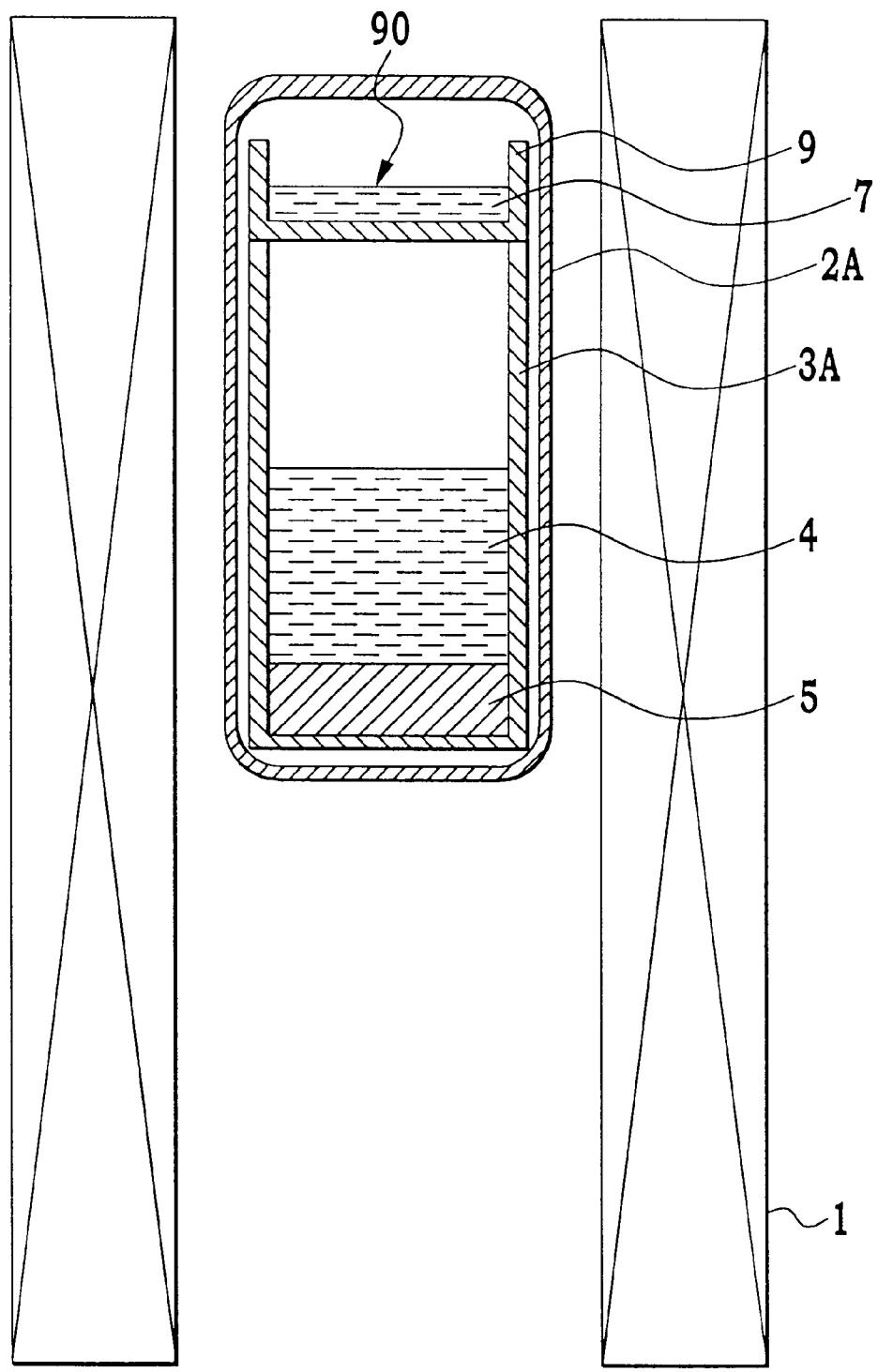
FIG. 2 is a schematic view for showing another embodiment of a crystal growth furnace used for carrying out the present invention.

FIG. 2 is a schematic view for showing another embodiment of a crystal growth furnace used for the present invention. In the furnace, a crucible 3A containing a compound semiconductor raw material and a solvent and a cover 9 put on the upper surface of the crucible 3A are enclosed in a closed tube system such as an ampoule 2A or the like, and the ampoule 2A is arranged at the center in a radial direction in a cylindrical multi-stage heater 1, the inner temperature distribution of which can be adjusted in a vertical direction. After the ampoule 2A is heated to sufficiently dissolve the compound semiconductor raw material in the solvent, the ampoule 2A is moved to a lower temperature side (the lower side in the Figure) in a predetermined temperature distribution in the furnace which is created by adjusting the power supplied to the heater 1, so that the solute is precipitated from the solution 4 to gradually grow a compound semiconductor single crystal 5 upward from the bottom of the crucible 3A.

A portion of or the whole of the crucible 3A is made of a porous material such as graphite or the like, although it is not limited to this. The vapor of the solvent evaporated from the solution 4 is efficiently diffused out of the crucible 3A by passing through the porous portion of the crucible 3A to make the evaporation rate higher. When the crucible 3A is provided with the porous portion, the vapor of the solvent which was evaporated from the solution 4 and diffused out of the crucible 3A does not return into the crucible 3A again through the porous portion of the crucible 3A after it was condensed and liquefied.

The ampoule 2A is formed with a shape and a size so that the gap between the inner surface thereof and the crucible 3A is as small as possible. The ampoule 2A is provided with no space in which the vapor of the solvent is condensed and accumulated. Therefore, the vapor of the solvent which was evaporated from the solution 4 and diffused out of the crucible 3A is not condensed nor accumulated in a lower temperature portion of the ampoule 2A.

The cover 9 has a vessel-like shape with a rising peripheral edge portion. The upper side of the cover 9 forms a solvent storage portion 90 for accumulating the solvent 7 which was evaporated from the solution 4 and condensed. A portion of or the whole of the cover 9 may be made of a porous material such as graphite or the like.

The solvent storage portion for accumulating the solvent which was evaporated from the solution 4 and diffused out of the crucible 3A, may be provided on the upper portion of the ampoule 2A or the like by working it, instead of providing the cover 9 as described above.

The crucible 3A and the cover 9 may not have a porous portion. In this case, it is preferable to provide a storage portion for accumulating the solvent which was evaporated and condensed, on an upper portion of the inside of the crucible 3A because the evaporated solvent is diffused in the space which is tightly covered by the crucible 3A and the cover 9.

In order to grow a compound semiconductor single crystal by using a crystal growth furnace shown in FIG. 2, after the compound semiconductor raw material (solute) and the solvent are put in the crucible 3A. The crucible 3A covered with the cover 9 is put in the ampoule 2A and the ampoule is sealed in vacuum, and a control of the vapor pressure therein is performed. Thereafter, the power supplied to the heater 1 is increased to rise the temperature for the solute to sufficiently dissolve in the solvent. When the temperature has reached to an appropriate one, the solute is dissolved in an environment having almost zero temperature gradient. After the solute has sufficiently dissolved, the power supplied to the heater 1 is adjusted to make the temperature distribution in the furnace so that the temperature of the bottom of the crucible 3A is lower, and the crucible 3A is arranged under the temperature gradient of the distribution.

Then, the ampoule 2A is gradually moved to the lower temperature side to start a crystal growth. When the crystal growth has been finished, cooling of the grown crystal is not started immediately, and the temperature distribution is controlled to make the temperature of the upper portion of the crucible 3A lower by adjusting the power supplied to the heater 1. At the occasion, it is preferable not to rise the temperature of the bottom portion of the crucible 3A. Such a temperature distribution in the furnace changes the remaining solvent in the crucible 3A to vapor and diffuses the vapor in the ampoule 2A by passing through the crucible 3A. The diffused vapor of the solvent in the ampoule 2A is transported to the lower temperature portion in the ampoule 2A to accumulate in the solvent storage portion 90 of the cover 9 by condensation.

During evaporation of the solvent after crystal growth, the temperature of the crucible 3A may be risen while maintaining a temperature gradient so that the temperature of the upper portion of the crucible 3A is lower. Accordingly, it is possible to more effectively evaporate the solvent to remove out of the crucible 3A. Further, such a manner has the advantage that it is possible to reduce the amount of the growth crystal dissolving into the solvent again because removal of the solvent out of the crucible 3A is effectively carried out.

By continuing the evaporating step until the residual solvent in the crucible 3A is sufficiently evaporated, it is possible to transport the residual solvent out of the crucible 3A to leave only the growth crystal in the crucible 3A.

After the solvent has been sufficiently evaporated, a cooling step for the grown crystal is conducted. By carrying out those steps, it is possible to prevent occurrence of cracks or defects in the grown crystal caused by the difference between the coefficients of thermal expansion of the solvent and of the grown crystal, and to obtain a compound semiconductor single crystal having a good crystallinity and no cracks.

When each of the crucible 3A and the cover 9 does not have a porous portion, it is preferable to provide a storage portion for accumulating the solvent which was condensed in the evaporation step, on an upper portion of the inside of the crucible 3A, and to control the temperature distribution in the furnace so that the solvent evaporated in the space which is tightly covered by the crucible 3A and the cover 9 is transported into the storage portion to condense.

The present invention is applicable to not only the vertical Bridgman method but also the horizontal Bridgman method and the gradient freeze method.

EXAMPLE 1

An example by which a ZnTe single crystal was grown by using a crystal growth furnace having a structure shown in FIG. 1 and by using Te as a solvent, will be explained as follows.

Te of 60 g as a solvent and ZnTe polycrystalline raw material of 68 g as a solute (the amount can be dissolved sufficiently in the Te solvent of 60 g at the crystal growth temperature) were put in a cylindrical crucible 3 having a diameter of 1 inch which was made of porous graphite. The crucible 3 was put in a quartz ampoule 2 and the ampoule was sealed in a vacuum of $2\times10^{-6}$ Torr. At the time, the container space 6 of the quartz ampoule 2 was empty. Then, the quartz ampoule 2 was located in the furnace and heated to a predetermined growth temperature (1140° C.) by a heater 1. The solute was dissolved sufficiently by keeping this state for two days. At this occasion, because the quartz ampoule 2 was arranged in a uniform temperature region of the furnace, no Te solvent was precipitated in the container space 6.

After the ZnTe polycrystalline raw material was dissolved, the temperature distribution in the furnace was changed by the heater 1 so that the temperature gradients in the starting region and the finishing region, for crystal growth were 10° C./cm and 5° C./cm, respectively, and the temperature gradients between those regions were gradually changed, thus, the crystal growth was started. The temperature of the lower side of the quartz ampoule 2 was set lower and the quartz ampoule 2 was moved toward the lower temperature side at the speed of 0.9 mm/hour, while keeping this state.

The starting temperature for crystal growth was 1100° C. and the temperature of the container space 6 at the time was 1030° C. Because the vapor pressure of Te from the solution 4 in the crucible 3 at 1100° C. was 0.74 atm and that of the Te solvent existing without solute at 1030° C. was 1.3 atm, that is, the vapor pressure (0.74 atm) of Te of the solution 4 at 1100° C. was sufficiently lower in comparison with that (1.3 atm) of the Te solvent existing without solute at 1030° C., no Te was precipitated in the container space 6. As the growth temperature is lowered and the solubility of ZnTe in the solvent is reduced, with progress of crystal growth, the difference between the vapor pressure of Te in the solution 4 in the crucible 3 and that of the Te solvent existing without solute 7 in the container space 6 is gradually decreased. The values of both the vapor pressures come to coincide with each other at the growth finishing temperature of 850° C. (which is equal to the temperature of the container space 6).

When the ratio of the amount of precipitated ZnTe crystal 5 which was a solute reached to 60%, the temperature distribution in the furnace was changed by the heater 1 so that the temperature of the upper surface of the remaining solution 4 was 950° C. and the temperature gradient thereof was 20° C./cm. The solvent evaporation step was started by moving the quartz ampoule 2 toward the lower temperature side at a speed of 0.9 mm/hour, while keeping the temperature distribution. As the result, the remaining solvent in the crucible 3 was evaporated out of the crucible 3. Thereafter, the crucible 3 was gradually cooled and the grown crystal was taken out of the crucible 3. As a result of examining the presence or absence of cracks or crystal defects for the growth ZnTe single crystal, no cracks and little defects were observed. Measurement of photo-luminescence for the obtained ZnTe single crystal was carried out. Consequently, it was verified that there was no luminescence from the deep level due to the impurities which had been observed in the raw material stage. Thereby, it was found that during crystal growth the impurities were gettered by the solvent, so that the grown crystal was purified. Analysis of impurities in the grown crystal was performed by a GDMS (glow discharge mass spectrometer). The results are shown in the following TABLE 1.

TABLE 1

| ELEMENT | B | Na | Mg | Si | P | Cl | K | Fe | Cu | As |
|---|---|---|---|---|---|---|---|---|---|---|
| CONCENTRATION (ppm) | 0.04 | 0.03 | <0.01 | 0.02 | <0.01 | <0.01 | <0.01 | <0.01 | <0.01 | <0.01 |

EXAMPLE 2

Another example by which a ZnTe single crystal was grown by using a crystal growth furnace having a structure shown in FIG. 2 and by using Te as a solvent, will be explained as follows.

Te of 90 g as a solvent and ZnTe polycrystalline raw material of 100 g as a solute (the amount can be dissolved sufficiently in the Te solvent of 90 g at the crystal growth temperature) were put in a cylindrical crucible 3A having a diameter of 1 inch which was made of porous graphite. After a cover 9 having an empty solvent storage portion 90 was put on the upper surface of the crucible 3A, the crucible 3A with the cover 9 was located in a quartz ampoule 2A and the ampoule was sealed in a vacuum of $2\times10^{-6}$ Torr. Then, the quartz ampoule 2A was located in the crystal growth furnace and heated to a predetermined growth temperature (1100° C.) by a heater 1. The solute was dissolved sufficiently by keeping this state for two days. At this occasion, because the quartz ampoule 2A was arranged in a uniform temperature region of the furnace, no Te solvent was solidified in the solvent storage portion 90.

After the ZnTe polycrystalline raw material was dissolved, the temperature distribution in the furnace was changed by the heater 1 so that the temperature gradient in the starting region for crystal growth was 10° C./cm and the temperature of the lower portion of the furnace was lower. Thus, the crystal growth was started while the quartz ampoule 2A was moved toward the lower temperature side at the speed of 3 cm/day.

When the temperature of the bottom portion of the crucible 3A was changed to 850° C., the temperature profile of the furnace was changed to have a temperature gradient so that the temperature of the upper portion of the furnace was lower. The bottom portion of the crucible 3A was risen up to 950° C. with a temperature rate of 50° C./day while keeping the temperature gradient. The remaining solvent in the crucible 3A was evaporated out thereof by keeping the state for 2 days. Thereafter, the crucible 3A was gradually cooled and the grown crystal was taken out thereof. As a result of examining the presence or absence of cracks or crystal defects for the growth ZnTe single crystal, no cracks and little defects were observed.

COMPARATIVE EXAMPLE 1

Figure 3A:
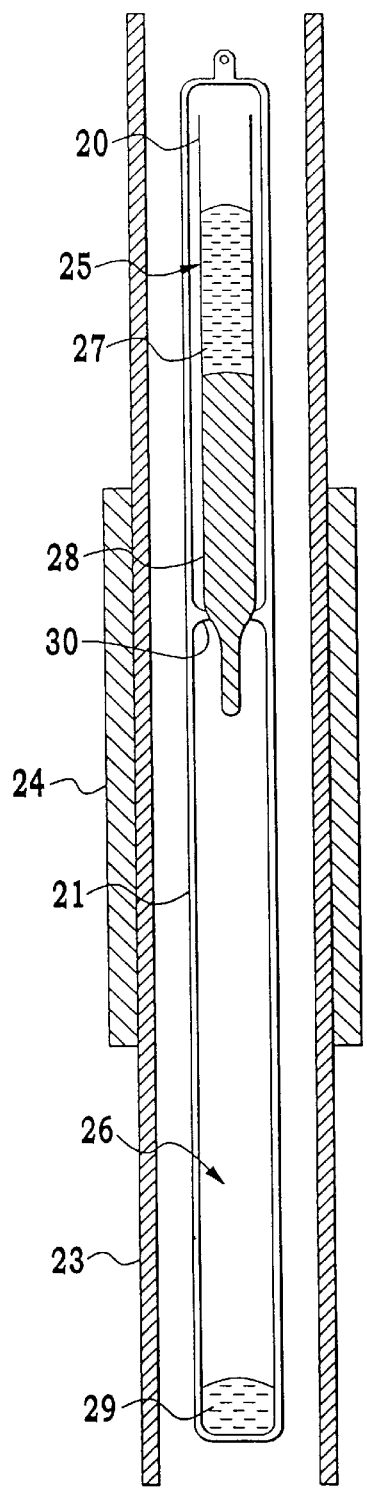
FIG. 3 is a schematic view for showing an example of a crystal growth furnace used for carrying out a conventional solvent evaporation method.
Figure 3B:
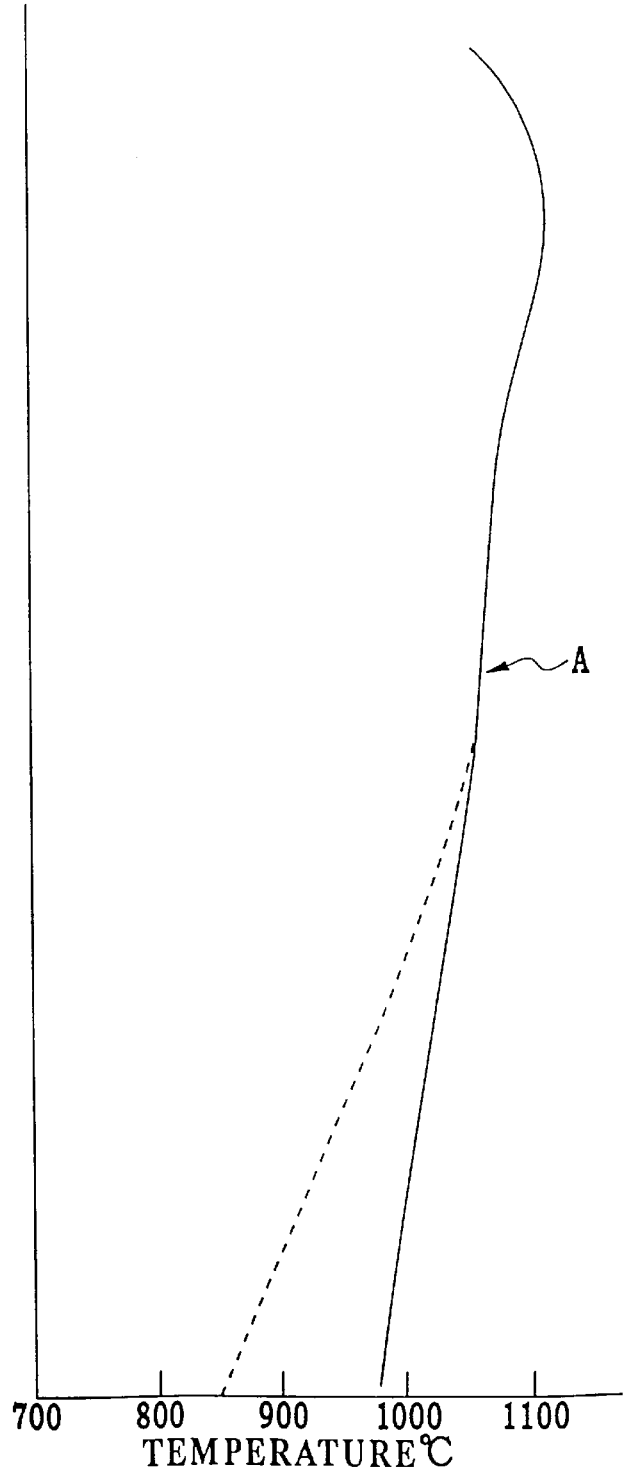

A ZnTe single crystal was grown by the solvent evaporation method, in particular, by using a crystal growth furnace having a structure shown in FIG. 3 and using Te as a solvent, in order to compare with the present invention.

Te of 60 g as a solvent and ZnTe polycrystalline raw material of 68 g as a solute (the amount can be dissolved sufficiently in the Te solvent of 60 g at the crystal growth temperature) were put in a crucible 20. The crucible 20 was enclosed in a quartz ampoule 21 in a vacuum of $2\times10^{-6}$ Torr. At the time, the reservoir portion 26 of the quartz ampoule 21 was empty. Then, the quartz ampoule 21 was located in the crystal growth furnace and heated to a predetermined growth temperature (1100° C.) by heaters 23 and 24. The solute was dissolved sufficiently by keeping this state.

After the ZnTe polycrystalline raw material was dissolved, the temperature of the reservoir portion 26 was lowered from 975° C. to 850° C. with a temperature rate of 0.5° C./hour, by using the heaters 23 and 24, to grow a crystal. In the quartz ampoule 21, an orifice 30 was provided.

After the crystal growth, the crucible 3 was gradually cooled and the grown crystal was taken out of the crucible. The obtained crystal was a ZnTe single crystal. Analysis of impurities in the grown crystal was performed by a GDMS. The results are shown in the following TABLE 2.

TABLE 2

| ELEMENT | B | Na | Mg | Si | P | Cl | K | Fe | Cu | As |
|---|---|---|---|---|---|---|---|---|---|---|
| CONCENTRATION (ppm) | 0.04 | 0.013 | 0.02 | 0.061 | 0.03 | 0.03 | 0.05 | 0.07 | 0.3 | 0.34 |

As clearly understood by comparing TABLES 1 and 2, according to the crystal growth method of the present invention, it is possible to obtain a ZnTe single crystal having a higher purity than that obtained by the solvent evaporation method of the comparative example. That is, it has been found that the method according to the present invention provides a higher purifying effect by the solvent, in comparison with the method of the comparative example.

In the conventional solvent evaporation method, it was required to form the orifice 30 between a crystal growth region 25 and the reservoir portion 26 and to use its own ampoule 21, in order to control the evaporation rate of the solvent. On the contrary, in the present invention, it was possible to use a general ampoule 2 or 2A which was easily available. Therefore, the production cost of the device according to the invention is cheaper than that of the conventional one.

Further, in the conventional solvent evaporation method, it was required to precisely control the evaporation rate of the solvent. On the contrary, in the method of the first example applying the present invention, the necessary control is very simple because it is required only to keep the crystal growth chamber 8 at a temperature in excess of 100–200° C. above that of the container space (which corresponds to a reservoir portion) 6.

In each of the above examples, although only methods for growing a ZnTe single crystal by using a solvent of Te were explained, the invention can be applied also for growing a ZnSe single crystal by using a solvent of Te or Se, growing a ZnSe single crystal by using a solvent of Zn, or the like.

A seed crystal may be also arranged on the bottom of the crucible or the like.

Industrial Applicability

The present invention comprises the step of; putting a raw material and a solvent for dissolving the raw material in a crucible, making a solution by dissolving the raw material in the solvent, cooling the solution to solidify and to grow a single crystal, thereafter removing the remaining solvent in the crucible by evaporation, and thereafter taking the grown single crystal out of the crucible. Consequently, it is possible to prevent introduction of cracks or defects into the grown single crystal and to obtain a compound semiconductor single crystal having a good crystallinity and no cracks.

I claim:

1. A method for growing a single crystal, comprising the step of;

putting a raw material and a solvent for dissolving the raw material in a crucible, making a solution by dissolving the raw material in the solvent, cooling the solution to solidify and to grow a single crystal, thereafter removing a remaining solvent in the crucible by evaporation, and thereafter taking the grown single crystal out of the crucible.

2. A method for growing a single crystal as claimed in claim 1, wherein the method comprises the steps of:

putting a raw material and a solvent for dissolving the raw material in a crucible, making a solution by dissolving the raw material in the solvent, and growing a single crystal under a temperature gradient so that a vapor pressure of a solvent in the solution is lower than a vapor pressure of a solvent which was transported out of the crucible to exist at one position selected between upper and higher portions of an ampoule, the position being effective for accumulating evaporated solvent, when the crystal growth is started, and under another temperature gradient so that the vapor pressure of the solvent in the solution is higher than the vapor pressure of the solvent which was transported out of the crucible to exist at the position when the crystal growth is finished.

3. A method for growing a single crystal as claimed in claim 2, wherein the method comprises the step of:

putting a raw material and a solvent for dissolving the raw material in a crucible, making a solution by dissolving the raw material in the solvent, growing a single crystal under a temperature gradient which forms a temperature lower portion and a temperature higher portion in the crucible containing the solution and which has a temperature gradient under which the solvent in the crucible is hardly evaporated out thereof, thereafter removing the remaining solvent in the crucible by evaporation under a temperature gradient so that the evaporated solvent in the crucible is transported to the position which is outside the crucible, and thereafter taking the grown single crystal out of the crucible.

4. A method for growing a single crystal as claimed in claim 1, 2, or 3, wherein the crucible containing the raw material and the solvent therein is enclosed in a sealed container which has a space for containing the crucible and another space for containing a solvent evaporated from the crucible.

5. A method for growing a single crystal as claimed in claim 1, 2, or 3, wherein the grown single crystal is a compound semiconductor one.

6. A method for growing a single crystal as claimed in claim 1, 2, or 3, wherein the solution comprises a solvent of Se or Te, and a raw material of ZnSe or ZnTe to be dissolved in the solvent.

* * * * *